(12) United States Patent
Krasinski

(10) Patent No.: US 6,850,948 B1
(45) Date of Patent: Feb. 1, 2005

(54) METHOD AND APPARATUS FOR COMPRESSING TEXTUAL DOCUMENTS

(75) Inventor: Raymond Krasinski, Suffern, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 368 days.

(21) Appl. No.: 09/699,609

(22) Filed: Oct. 30, 2000

(51) Int. Cl.[7] .......................... G06F 17/00; G06F 15/16
(52) U.S. Cl. ...................... 707/101; 709/247; 715/513; 715/514
(58) Field of Search ............................ 707/1, 100, 101; 715/513, 500.1, 514; 709/247, 246; 751/1, 100–101, 513, 500.1; 704/700, 251, 275

(56) References Cited

U.S. PATENT DOCUMENTS

| | | | |
|---|---|---|---|
| 5,991,713 A | * 11/1999 | Unger et al. | 704/9 |
| 6,012,098 A | 1/2000 | Bayeh et al. | |
| 6,175,820 B1 | * 1/2001 | Dietz | 704/235 |
| 6,635,088 B1 | * 10/2003 | Hind et al. | 715/513 |

FOREIGN PATENT DOCUMENTS

| | | | |
|---|---|---|---|
| EP | 0928070 A2 | 7/1999 | ............ H03M/7/30 |
| EP | 0991018 A2 | 5/2000 | ............ G06T/9/00 |
| GB | 2307571 A | 5/1997 | ............ G06F/17/27 |
| WO | WO9834179 | 8/1998 | ............ G06F/17/30 |
| WO | WO0033156 | 6/2000 | |

OTHER PUBLICATIONS

Girardot et al: "Millau: An Encoding Format For Efficient Representation And Exchange Of XML Over The Web" Computer Networks and ISDN Systems, North Holland Publishing, Amsterdam, NL, vol. 33, No. 1–6, Jun. 2000, pp. 747–765.

Liefke et al: "Xmill: An Efficient Compressor For XML Data" Sigmod Record, Association For Computing Machinery, New York, US, vol. 29, No. 2, Jun. 2000, pp. 153–164.

* cited by examiner

*Primary Examiner*—Alford W. Kindred
(74) *Attorney, Agent, or Firm*—Gregory L. Thorne

(57) ABSTRACT

A method and apparatus are disclosed for compressing textual documents encoded using a tag-based markup language, such as XML or SGML documents, in a manner that allows a compressed document to be processed without decompression. A document is compressed using a standard compression algorithm that is applied only to the data elements of the document. The tag elements of the XML document that impose the hierarchical structure on the data elements are not compressed. The hierarchical relationship of the data elements can be ascertained from the compressed document. A user can thereafter selectively decompress desired portions of the document, without decompressing the entire document. An identification of the employed compression technique can be inserted into a root node tag element of the XML document or into an additional tag element pair that is inserted into the XML document. An XML decoder can utilize the uncompressed tag elements to ascertain the hierarchical structure of the compressed data and present the user with a corresponding hierarchical expression of the document.

21 Claims, 4 Drawing Sheets

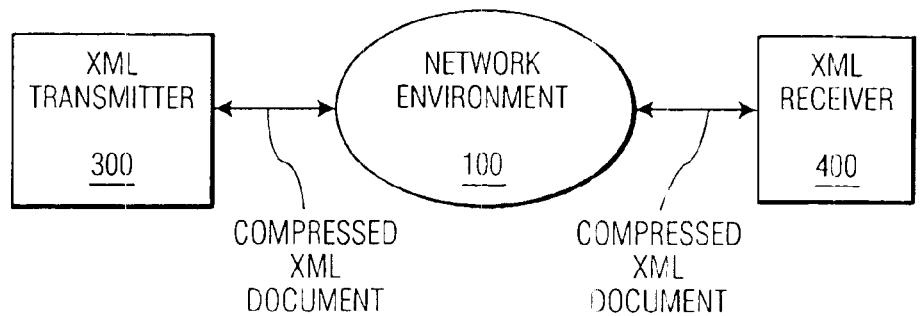
FIG. 1
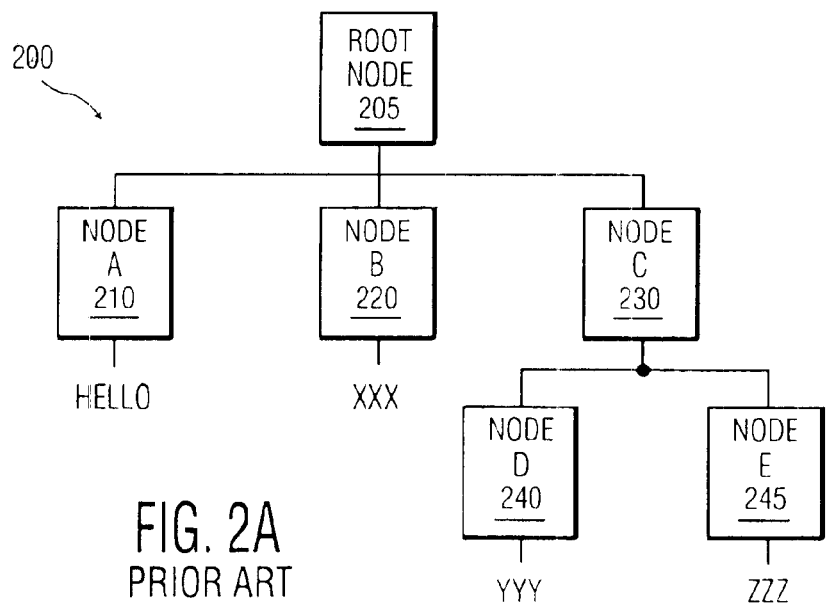
FIG. 2A
PRIOR ART
250 {
```
<ROOT>
<A> HELLO </A>
<B> XXX </B>
<C> <D> YYY </D> <E> ZZZ </E> </C>
</ROOT>
```
FIG. 2B
PRIOR ART

```
             265
       ┌─────┴─────┐
      ┌ <ROOT.COMPRESSION=ZIP>
      │ <A> ^compressed data^ </A>
      │ <B> ^compressed data^ </B>
  260 ┤ <C> <D> ^compressed data^ </D> <E>
      │ ^compressed data^ </E> </C>
      └ </ROOT>
```

```
                          275
      ┌ <COMPRESSED TYPE=ZIP>
      │ <ROOT>
      │ <A> ^compressed data^ </A>
      │ <B> ^compressed data^ </B>
  270 ┤ <C> <D> ^compressed data^ </D> <E>
      │ ^compressed data^ </E> </C>
      │ </ROOT>
      └ </COMPRESSED>  ──── 276
```

METHOD AND APPARATUS FOR COMPRESSING TEXTUAL DOCUMENTS

FIELD OF THE INVENTION

The present invention relates to the compression of information, and more particularly, to the compression of textual documents encoded using tag-based markup languages, such as the Extensible Markup Language (XML) or the Standard Generalized Markup Language (SGML).

BACKGROUND OF THE INVENTION

The Extensible Markup Language (XML) is a standard for encoding textual information that has been recommended by the World Wide Web Consortium (W3C). Likewise, the Standard Generalized Markup Language (SGML) is an international standard (ISO 8879) meta-language that predates XML and is an ancestor to XML. SGML is a language for describing a document structure. XML is a simplification of SGML that is easier to use. For a discussion of the XML and SGML standards, see, for example, Extensible Markup Language (XML) 1.0 W3C Recommendation, http://www.w3.org/TR/1998/REC-xml-19980210; and http://www.w3org/markup/SGML/overview.html, respectively, each incorporated by reference herein.

The illustrative XML standard allows XML-enabled applications to inter-operate with other compliant systems for the exchange of encoded information. XML documents store textual data in a hierarchical tree structure. Each XML document has one root node, often referred to as the root element, with the other nodes in the hierarchical tree being arranged as descendants of the root node. Each XML document contains two types of elements, namely, data elements and the corresponding tag elements that impose the hierarchical structure on the data elements.

Since XML documents contain only textual information, the documents can be quite large in size. In order to reduce the size of XML documents for transmission and storage, standard compression algorithms suitable for textual information have been applied to entire XML documents. While the application of such standard compression techniques to entire XML documents has been an effective technique for reducing the overall size of such XML documents, this technique suffers from a number of limitations, which if overcome, could greatly expand the efficiency and usefulness of the compressed XML documents. Specifically, the compressed XML documents generated by such conventional XML compression techniques must be decompressed to be useful. A need therefore exists for a method and apparatus that compresses XML documents in a manner that allows the document to be processed in a compressed form.

SUMMARY OF THE INVENTION

Generally, a method and apparatus are disclosed for compressing textual documents encoded using a tag-based markup language, such as XML or SGML documents, in a manner that allows a compressed XML document to be processed without decompression. The present invention compresses a textual document using a standard compression algorithm that is applied only to the data elements of the document. The tag elements of the document that impose the hierarchical structure on the data elements are not compressed. Thus, the present invention allows the hierarchical relationship of the data elements to be ascertained from the compressed document. Once the hierarchical relationship of the data elements is obtained from the compressed document, a user can selectively decompress desired portions of the document, without decompressing the entire document.

In one exemplary embodiment, an identification of the employed compression technique is inserted into a root node tag element of the document. In another exemplary embodiment, an additional tag element pair is inserted into the document and an indication of the employed compression technique is inserted into the additional tag element pair. The present invention allows a decoder to utilize the uncompressed tag elements in the otherwise compressed document to ascertain the hierarchical structure of the compressed data and present the user with a corresponding hierarchical expression of the document.

A more complete understanding of the present invention, as well as further features and advantages of the present invention, will be obtained by reference to the following detailed description and drawings.

BRIEF DESCRIPTION OF THE DRAWINGS

FIG. 1 illustrates a representative network environment where the present invention may operate;

FIG. 2A illustrates a conventional hierarchical XML document tree in an uncompressed format;

FIG. 2B illustrates a portion of the corresponding conventional pseudo-code necessary to construct the hierarchical XML tree of FIG. 2A;

DETAILED DESCRIPTION

Figures 2C, 2D, 2E:
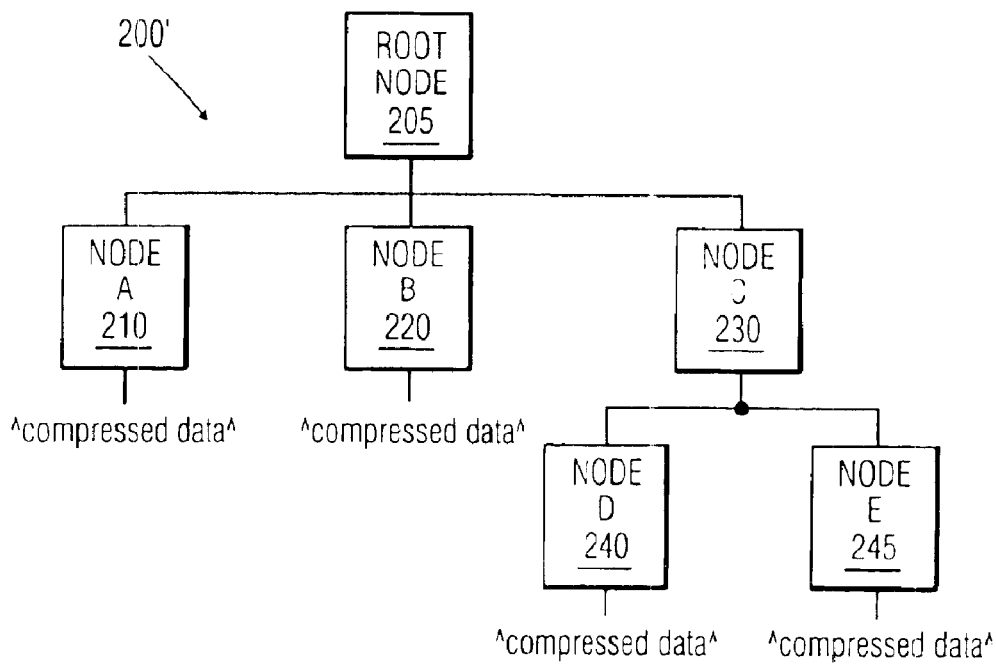
FIG. 2C illustrates the pseudo-code of FIG. 2B as compressed in accordance with one embodiment of the present invention.
FIG. 2D illustrates the pseudo-code of FIG. 2B as compressed in accordance with another embodiment of the present invention.
FIG. 2E illustrates the hierarchical XML document tree in a compressed format according to the present invention.

FIG. 1 illustrates a network environment 100 where the present invention may operate. As shown in FIG. 1, an XML transmitter 300, discussed below in conjunction with FIG. 3, transmits a compressed XML document to an XML receiver 110. In a further application of the present invention, the compressed XML document may be sent over the network 100 to a server (not shown) for storage, or stored locally by the XML transmitter 300.

FIG. 2A illustrates an XML document tree 200, and FIG. 2B illustrates a portion of the corresponding pseudo-code 250 necessary to construct the XML tree 200 of FIG. 2A. As shown in FIG. 2A, the XML document tree 200 includes a root node 205 and a number of sub-nodes 210, 220, 230, 240 and 245. As shown in FIG. 2B, an XML document, such as the document 200, contains two types of elements, namely, data elements and the corresponding tag elements that impose the hierarchical structure on the data elements. It is noted that in the illustrative notation used in FIG. 2B, each tag element is identified within braces "<>" to distinguish the tag elements from the data elements.

As shown in FIG. 2B, one feature of the XML language is that tag elements are utilized in matched pairs, with an opening and closing tag element corresponding to each node. It is noted that additional tag element pairs that do not directly correspond to a given node may also be included in an XML document, in a known manner.

In accordance with the present invention, the XML transmitter 300 compresses the XML document 200 using a standard compression algorithm that is applied only to the data elements of the document. Thus, the tag elements are not compressed. Among other benefits, the compression technique of the present invention allows the document to be validated by standard XML parsers without decompressing the document. In addition, the present invention allows a user to work with the compressed document and ascertain the hierarchical relationship of the compressed data, without actually decompressing the data. Thus, the user can thereafter selectively decompress only desired portions of the document.

FIGS. 2C and 2D illustrate how the pseudo-code of FIG. 2B is compressed in accordance with two exemplary embodiments of the present invention. As shown in FIGS. 2C and 2D, a standard compression algorithm is applied to only the data elements of the XML document 200 and the tag elements are not compressed. In a first exemplary embodiment, shown in FIG. 2C, an identification of the employed compression technique 265 is inserted into the root node tag element. In a second exemplary embodiment, shown in FIG. 2D, an additional tag element pair 275, 276 indicating the employed compression technique is inserted into the pseudo-code 270. In both exemplary embodiments of the present invention, the XML provisions regarding Document Type Definitions (DTDs) are modified to support the indication of the employed compression algorithm.

FIG. 2E illustrates the hierarchical expression of the XML document 200' in a compressed format according to the present invention. An XML decoder can utilize the uncompressed tag elements of the compressed XML document 200' to ascertain the hierarchical structure of the compressed data and present the user with the hierarchical expression shown in FIG. 2E.

Figure 3:
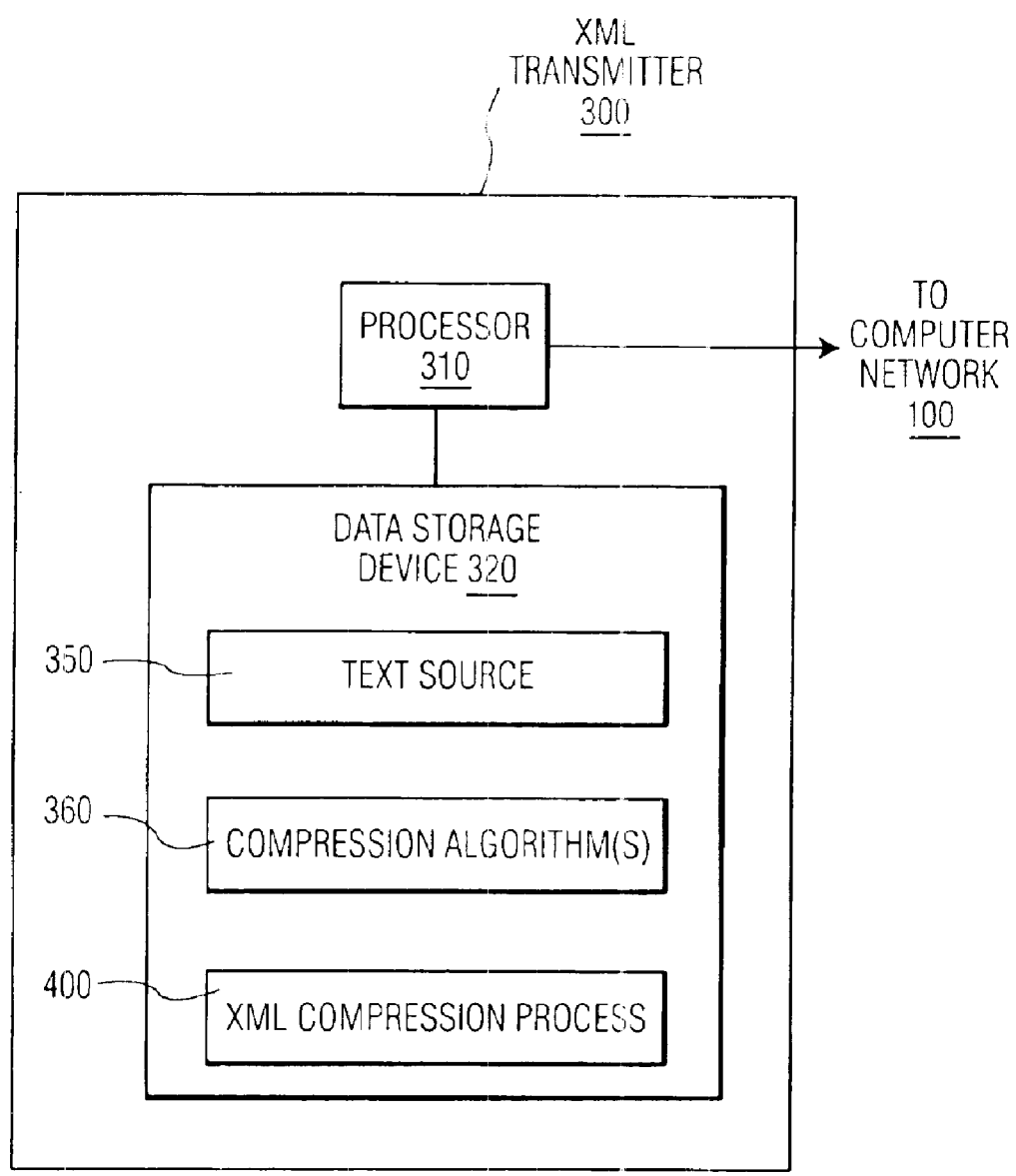
FIG. 3 is a block diagram showing the architecture of an illustrative XML transmitter in accordance with the present invention.

FIG. 3 is a block diagram showing the architecture of an illustrative XML transmitter 300 in accordance with the present invention. The XML transmitter 300 may be embodied as a general purpose computing system, such as the general purpose computing system shown in FIG. 3. As shown in FIG. 3, the XML transmitter 300 preferably includes a processor 310 and related memory, such as a data storage device 320, which may be distributed or local. The processor 310 may be embodied as a single processor, or a number of local or distributed processors operating in parallel. The data storage device 320 and/or a read only memory (ROM) (not shown) are operable to store one or more instructions, which the processor 310 is operable to retrieve, interpret and execute.

The data storage device 320 includes a text source 350 that may be retrieved from memory or generated in real-time. Thus, the text source 350 may be a pre-recorded textual file, such as a database or another document, or a document generated in real-time, for example, by a user entering textual information from a keyboard (not shown) or by a speech recognition system (not shown). The data storage device 320 also includes one or more compression algorithm(s) 360 that are suitable for compressing textual information. For example, the compression algorithm(s) 360 may be embodied as the WinZip™ compression utility application, commercially available from Nico Mak Computing, Inc., of Mansfield, Conn., as modified herein to carry out the features and functions of the present invention. Thus, the XML transmitter 300 can process the text source 350 using an identified compression algorithm 360 to generate the compressed document, in accordance with the present invention.

The data storage device 320 also includes an XML compression process 400, discussed hereinafter in conjunction with FIG. 4, that compresses each data field in an XML document 200, and leaves each tag uncompressed.

Figure 4:
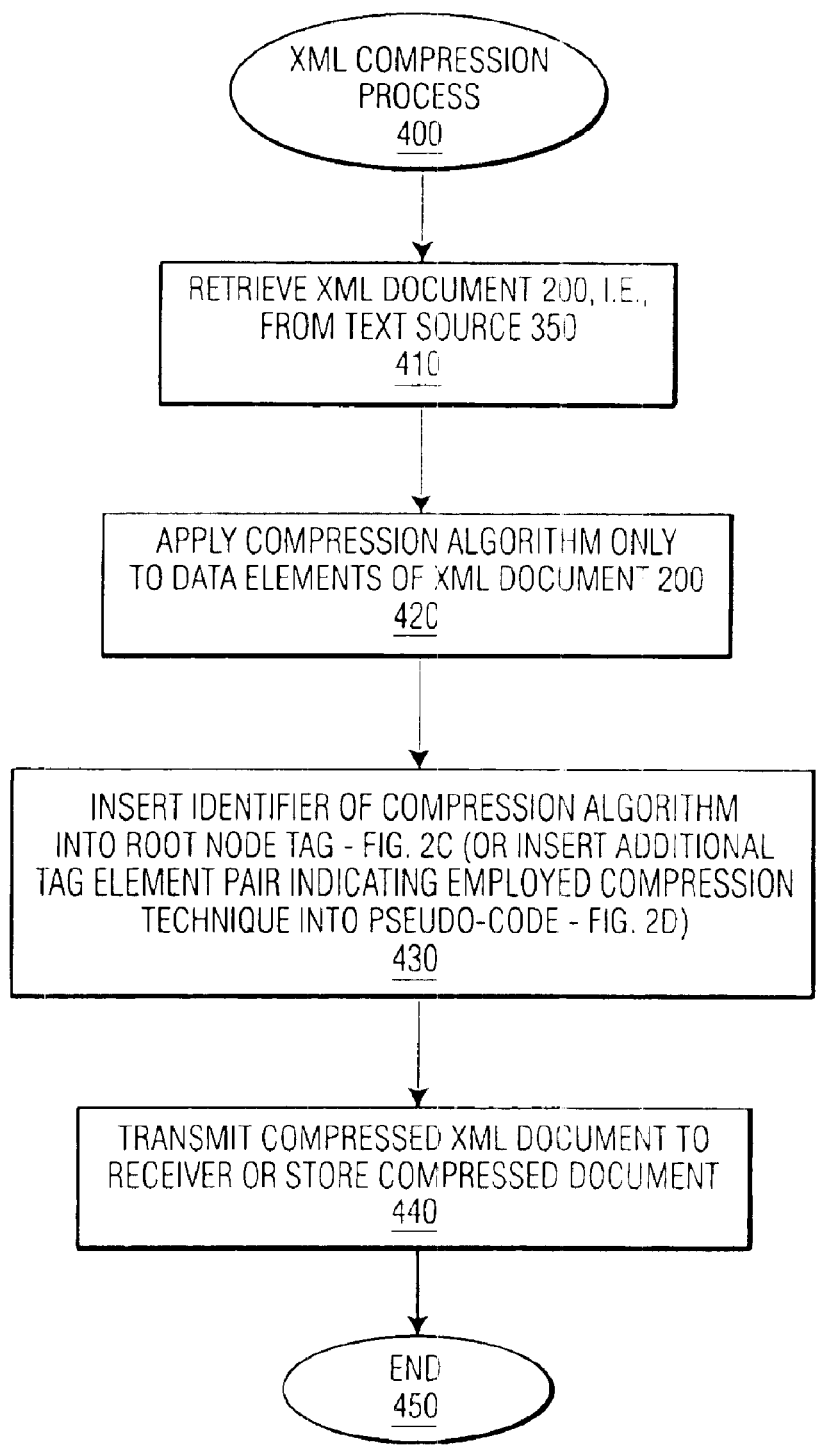
FIG. 4 is a flow chart describing an exemplary XML compression process 400 executed by the XML transmitter of FIG. 3.

FIG. 4 is a flow chart describing an exemplary XML compression process 400 executed by the XML transmitter 300 of FIG. 3. As previously indicated, the XML compression process 400 compresses each data field in an XML document 200, and leaves each tag uncompressed. As shown in FIG. 4, the XML compression process 400 initially retrieves the XML document 200 to be compressed, for example, from the text source 350 (FIG. 3) during step 410.

Thereafter, the XML compression process 400 applies a standard compression algorithm 360 (FIG. 3) to only the data elements of the XML document 200 during step 420. The XML compression process 400 then inserts an identifier 265 of the employed compression algorithm 360 into the root node tag, in accordance with the embodiment shown in FIG. 2C, or inserts an additional tag element pair 275 indicating the employed compression algorithm 360 into the pseudo-code 270, in accordance with the embodiment shown in FIG. 2D. In this manner, the XML decoder can utilize the same compression algorithm 360 to decompress the compressed XML document 200.

Finally, the XML compression process 400 transmits the compressed XML document 200 to a receiver 110 over the network 100, or stores the compressed XML document 200 (remote or local storage). Program control then terminates during step 450.

It is to be understood that the embodiments and variations shown and described herein are merely illustrative of the principles of this invention and that various modifications may be implemented by those skilled in the art without departing from the scope and spirit of the invention.

What is claimed is:

1. A method of compressing a textual document comprised of data elements and tag elements that impose a hierarchical structure on said data elements, said method comprising the steps of:

identifying said data elements in said document; and
   compressing only said data elements in said document using a compression algorithm that has a corresponding decompression facet, wherein said document before and after the compressing step is in a given file format.

2. The method of claim 1, further comprising the step of inserting an identifier of said compression algorithm in said document.

3. The method of claim 2, wherein said step of inserting an identifier of said compression algorithm in said document inserts said identifier in a root node tag element.

4. The method of claim 2, wherein said step of inserting an identifier of said compression algorithm in said document further comprises the steps of inserting a new tag element in said document and inserting said identifier in said new tag element.

5. The method of claim 1, further comprising the step of transmitting said compressed document.

6. The method of claim 1, further comprising the step of storing said compressed document.

7. The method of claim 1, wherein said document is generated in real-time by a user operating a textual input device.

8. The method of claim 1, wherein said document is generated in real-time by a speech recognition system.

9. The method of claim 1, wherein said document is an XML document.

10. The method of claim 1, wherein said document is an SGML document.

11. A method of compressing a document, said document comprised of data elements and tag elements that impose a hierarchical structure on said data elements, said method comprising the steps of:
- compressing only said data elements in said document using a compression algorithm; and
- inserting an identifier of said compression algorithm in said document, wherein said document before and after the compressing step is in a given file format.

12. The method of claim 11, wherein said step of inserting an identifier of said compression algorithm in said document inserts said identifier in a root node tag element.

13. The method of claim 11, wherein said step of inserting an identifier of said compression algorithm in said document further comprises the steps of inserting a new tag element in said document and inserting said identifier in said new tag element.

14. The method of claim 11, further comprising the step of transmitting said compressed document.

15. The method of claim 11, further comprising the step of storing said compressed document.

16. The method of claim 11, wherein said document is generated in real-time by a user operating a textual input device.

17. The method of claim 11, wherein said document is generated in real-time by a speech recognition system.

18. A system for compressing a document, said document comprised of data elements and tag elements that impose a hierarchical structure on said data elements, said system comprising:
- a memory for storing content and computer readable code; and
- a processor operatively coupled to said memory, said processor configured to:
- identify said data elements in said document; and
- compress only said data elements in said document using a compression algorithm that has a corresponding decompression facet, wherein said document before and after compression is in a given file format.

19. A system for compressing a document, said document comprised of data elements and tag elements that impose a hierarchical structure on said data elements, said system comprising:
- a memory for storing content and computer readable code; and
- a processor operatively coupled to said memory, said processor configured to:
- compress only said data elements in said document using a compression algorithm; and
- insert an identifier of said compression algorithm in said document, wherein said document before and after compression is in a given file format.

20. An article of manufacture for compressing a document, said document comprised of data elements and tag elements that impose a hierarchical structure on said data elements, comprising:
- a computer readable medium having computer readable code means embodied thereon, said computer readable program code means comprising:
- a step to identify said data elements in said document; and
- a step to compress only said data elements in said document using a compression algorithm that has a corresponding decompression facet, wherein said document before and after compression is in a given file format.

21. An article of manufacture for compressing a document, said document comprised of data elements and tag elements that impose a hierarchical structure on said data elements, comprising:
- a computer readable medium having computer readable code means embodied thereon, said computer readable program code means comprising:
- a step to compress only said data elements in said document using a compression algorithm; and
- a step to insert an identifier of said compression algorithm in said document, wherein said document before and after compression is in a given file format.

* * * * *